US007954869B2

(12) United States Patent
Shim et al.

(10) Patent No.: US 7,954,869 B2
(45) Date of Patent: Jun. 7, 2011

(54) PICK AND PLACE APPARATUS

(75) Inventors: Jae Gyun Shim, Suwon-si (KR); Yun Sung Na, Cheonan-si (KR); In Gu Jeon, Suwon-si (KR); Tae Hung Ku, Suwon-si (KR); Dong Hyun Yo, Bucheon-si (KR)

(73) Assignee: Techwing Co., Ltd., Gyeonggi-do (KR)

( * ) Notice: Subject to any disclaimer, the term of this patent is extended or adjusted under 35 U.S.C. 154(b) by 536 days.

(21) Appl. No.: 12/090,413

(22) PCT Filed: Nov. 15, 2006

(86) PCT No.: PCT/KR2006/004792
§ 371 (c)(1),
(2), (4) Date: Apr. 16, 2008

(87) PCT Pub. No.: WO2007/058459
PCT Pub. Date: May 24, 2007

(65) Prior Publication Data
US 2008/0284186 A1    Nov. 20, 2008

(30) Foreign Application Priority Data
Nov. 15, 2005    (KR) .................. 10-2005-0109164

(51) Int. Cl.
*H01L 21/68* (2006.01)
*B65G 47/26* (2006.01)
(52) U.S. Cl. .................. 294/65; 294/87.1; 198/468.3
(58) Field of Classification Search ............. 198/468.3, 198/468.4; 294/65, 87.1, 64.1; 414/416.02, 414/627, 737, 754
See application file for complete search history.

(56) References Cited

U.S. PATENT DOCUMENTS

| 4,597,819 | A | * | 7/1986 | Kusuhara et al. | ........ 156/345.54 |
| 5,575,376 | A | * | 11/1996 | Colamussi | ................ 198/468.3 |
| 5,839,769 | A | * | 11/1998 | Slocum et al. | ............... 294/87.1 |
| 6,068,317 | A | * | 5/2000 | Park | ........................... 294/87.1 |
| 6,352,402 | B1 | * | 3/2002 | Hwang et al. | .............. 414/752.1 |
| 6,439,631 | B1 | * | 8/2002 | Kress | ............................. 294/65 |
| 7,023,197 | B2 | * | 4/2006 | Jung | ....................... 324/757.01 |
| 7,234,744 | B2 | * | 6/2007 | Osten et al. | ..................... 294/65 |
| 7,390,040 | B2 | * | 6/2008 | Subotincic | ...................... 294/65 |
| 7,464,807 | B2 | * | 12/2008 | Ham et al. | ................ 198/468.3 |
| 7,690,706 | B2 | * | 4/2010 | Wild et al. | ..................... 294/65 |

FOREIGN PATENT DOCUMENTS

| JP | 05-293783 | 11/1993 |
| JP | 06-169002 | 6/1994 |

(Continued)

*Primary Examiner* — Douglas A Hess
(74) *Attorney, Agent, or Firm* — BainwoodHuang

(57) ABSTRACT

A pick and place apparatus includes a $1^{st}$ to an $n^{th}$ device holding element arranged in a lengthwise direction, every one of the $1^{st}$ to the $n^{th}$ device holding element being connected to its neighboring one(s) of the $1^{st}$ to the $n^{th}$ device holding element by means of at least one pitch setting ring; a belt having a first coupling part at an upper part thereof for being coupled to the $1^{st}$ device holding element and a second coupling part at a lower part thereof for being coupled to the $n^{th}$ device holding element; and a driven pulley and a differential pulley. The driven and the differential pulley are rotated by being engaged with the belt to move the $1^{st}$ and the $n^{th}$ device holding element such that the $1^{st}$ device holding element moves in a direction opposite to the $n^{th}$ device holding element.

18 Claims, 8 Drawing Sheets

FOREIGN PATENT DOCUMENTS

| | | |
|---|---|---|
| KR | 1998-0033607 | 7/1998 |
| KR | 1998-062567 | 11/1998 |
| KR | 1998-062568 | 11/1998 |
| KR | 100248704 | 12/1999 |
| KR | 20020031461 | 5/2002 |
| KR | 20030029266 | 4/2003 |
| KR | 20030062702 | 7/2003 |
| KR | 20040020310 | 3/2004 |
| KR | 20040043925 | 5/2004 |
| KR | 100596739 | 6/2006 |

* cited by examiner

PICK AND PLACE APPARATUS

TECHNICAL FIELD

The present invention relates to a pick and place apparatus employed in a test handler for use in testing semiconductor devices; and, more particularly, to a pick and place apparatus capable of controlling distances between device holding elements incorporated in the pick and place apparatus. Further, still more particularly, the present invention relates to a pick and place apparatus capable of controlling distances (hereinafter, referred to as "pitches") between the device holding elements in a left-and-right direction (in general, defined as an X-axis direction and hereinafter, referred to as a "lengthwise direction").

BACKGROUND ART

A test handler is an apparatus for testing semiconductor devices in a certain test environment to inspect the qualities of the semiconductor devices after they are fabricated. Techniques related to the test handler are disclosed in many published documents including Korean Utility Model Publication No. 1998-0062568 (entitled "Tray Catcher Of Handler System For Testing Semiconductor Device"), Korean Utility Model Publication No. 1998-0062567 (entitled "Transfer Device Of A Handler System"), Korean Patent Publication No. 2003-0062702 (entitled "Tray Transfer Of Handler For Testing Semiconductor"), Korean Patent Publication No. 2004-0043925 (entitled "Tray Transferring Apparatus"), Korean Patent Publication No. 2002-0031461 (entitled "Tray Transfer For Handler") and Korean Patent Publication No. 2003-0029266 (entitled "Test Handler").

To conduct a test by using the test handler, it is required to transfer semiconductor devices from a customer tray, which is used to accommodate the semiconductor devices after their fabrication, into a test tray, which is used to accommodate the semiconductor devices during the test. After the completion of the test, the semiconductor devices should be transferred back into the customer tray. The present invention pertains to a pick and place apparatus for transferring the semiconductor devices between the customer tray and the test tray. For the purpose, the pick and place apparatus includes a plurality of device holding elements operated to grasp or quit the grasp of the semiconductor devices.

As for the customer tray, since the customer tray is used to load or store the semiconductor devices therein, the customer tray is designed to provide a small interval between the semiconductor devices loaded therein to accommodate as many semiconductor devices as possible on the same area. Meanwhile, since a certain amount of interval needs to be maintained between the semiconductor devices for the test of the semiconductor devices, the test tray is designed to provide a relatively larger interval between the semiconductor devices loaded therein, in comparison with the customer tray.

Accordingly, the pitch between the device holding elements of the pick and place apparatus should be at a minimum level when they pick and grasp the semiconductor devices from the customer tray or quit the grasp of the devices, while the pitch should be at a maximum level when the device holding elements pick and grasp the semiconductor devices from the test tray or quit the grasp of them. For the purpose, the pick and place apparatus needs to have a means for controlling the intervals between the plurality of device holding elements in a preset arrangement. Techniques related thereto are disclosed in, for example, Korean Patent Publication No. 10-1998-033607 (entitled "Pick and Place of Semiconductor Device Test Equipment") that discloses picker interval control means for controlling intervals between pickers which are equivalent to device holding elements in the present invention. More particularly, the picker interval control means includes a pair of interval control cylinders moving in the lengthwise direction; a fixing bracket for fixing the pair of interval control cylinders to a picker assembler; and a pair of fixing blocks attached to both sides of the pair of interval control cylinders to be installed at picker bases of both end portions. According thereto, lengthwise pitches between eight device holding elements are varied by using the pair of interval control cylinders moving in different directions.

In accordance with the above-mentioned equipment, powers of the pairs of the interval control cylinders are applied to a first device holding element and an eighth device holding element of the device holding element, respectively, and the remaining second to seventh device holding elements are moved pursuant to the movements of the first and the eighth device holding elements. Thus, a minimum pitch is determined by widths of the device holding elements, and a maximum pitch is determined by rings for connecting neighboring device holding element(s). Since the first device holding element moves in a direction opposite to the eighth device holding element, a pair of cylinders are required for supplying powers to the first and the eighth device holding elements.

However, the above-mentioned equipment has drawbacks as following. First, since the interval control cylinders need to be used together with solenoid devices and pneumatic pressure applying devices, the production cost and the weight of the equipment as a whole are increased. Further, since the pitches between the device holding elements are increased or decreased due to the movements of the pair of the interval control cylinders that are configured as separate elements, precise interval controls are required for, e.g., adjusting the movements of the pair of the interval control cylinders to be in concord with each other, but such precise controls are difficult to be implemented.

DISCLOSURE OF INVENTION

Technical Problem

It is, therefore, an object of the present invention to provide a pick and place apparatus capable of controlling lengthwise pitches between device holding elements by using an electric motor and/or a belt instead of a pair of interval control cylinders.

Technical Solution

In accordance with one aspect of the present invention, there is provided a pick and place apparatus including a $1^{st}$ to an $n^{th}$ device holding element arranged in a lengthwise direction, every one of the $1^{st}$ to the $n^{th}$ device holding element being connected to its neighboring one(s) of the $1^{st}$ to the $n^{th}$ device holding element by means of at least one pitch setting ring; a first belt having a first coupling part at an upper part thereof for being coupled to the $1^{st}$ device holding element and a second coupling part at a lower part thereof for being coupled to the $n^{th}$ device holding element; and a first driven pulley and a first differential pulley for being rotated by being engaged with the first belt to move the $1^{st}$ and the $n^{th}$ device holding elements such that the $1^{st}$ device holding element moves in a direction opposite to the $n^{th}$ device holding element.

Preferably, the first differential pulley is rotated by an electric motor.

Preferably, the first differential pulley is rotated by a pneumatic cylinder in connection with a rack and a pinion.

Preferably, the first belt is a timing belt, and the first differential pulley is a timing pulley.

Preferably, the $1^{st}$ to the $n^{th}$ device holding element moves linearly along at least one LM guide.

Preferably, the pick and place apparatus further includes an $(n+1)^{th}$ to a $2n^{th}$ device holding element arranged to respectively face the $1^{st}$ to the $n^{th}$ device holding element, every one of the $(n+1)^{th}$ to the $2n^{th}$ device holding element being connected to its lengthwisely neighboring one(s) of $(n+1)^{th}$ to the $2n^{th}$ device holding element by means of at least one pitch setting ring; a second belt having a third coupling part at an upper part thereof for being coupled to the $(n+1)^{th}$ device holding element and a fourth coupling part at a lower part thereof for being coupled to the $2n^{th}$ device holding element; and a second driven pulley and a second differential pulley for being rotated by being engaged with the second belt to move the $(n+1)^{th}$ and the $2n^{th}$ device holding element such that the $(n+1)^{th}$ device holding element moves in a direction opposite to the $2n^{th}$ device holding element.

Preferably, the first and the second differential pulley are rotated by a single electric motor.

Preferably, the first and the second differential pulley are rotated by a single pneumatic cylinder in connection with a rack and a pinion.

In accordance with another aspect of the present invention, there is provided a pick and place apparatus including a $1^{st}$ to an $n^{th}$ device holding element arranged in a predetermined arrangement; a plurality of pitch setting rings for connecting every one of the $1^{st}$ to the $n^{th}$ device holding element to its neighboring one(s) of the $1^{st}$ to the $n^{th}$ device holding element, and restricting a maximum pitch between the $1^{st}$ to the $n^{th}$ device holding element; a first belt capable of forward and reverse rotation for moving the $1^{st}$ device holding element and the $n^{th}$ device holding element such that the $1^{st}$ device holding element moves in a direction opposite to the $n^{th}$ device holding element; a differential pulley and a driven pulley for rotating the first belt; and a power supply mechanism for supplying power for the forward and the reverse rotation of the differential pulley.

Preferably, the first belt includes a first coupling part positioned at an upper part of the first belt to be coupled to the $1^{st}$ device holding element; and a second coupling part positioned at an lower part of the first belt to be coupled to the $n^{th}$ device holding element.

Preferably, the power supply mechanism is an electric motor.

In accordance with still another aspect of the present invention, there is provided a pick and place apparatus including a $1^{st}$ to an $n^{th}$ device holding element arranged in a predetermined arrangement; a plurality of pitch setting rings for connecting every one of the $1^{st}$ to the $n^{th}$ device holding element to its neighboring one(s) of the $1^{st}$ to the $n^{th}$ device holding element, and restricting a maximum pitch between the $1^{st}$ to the $n^{th}$ device holding element; an electric motor capable of forward and reverse rotation for moving the $1^{st}$ device holding element and the $n^{th}$ device holding element such that the $1^{st}$ device holding element moves in a direction opposite to the $n^{th}$ device holding element; and a power delivery mechanism for delivering power of the electric motor to the $1^{st}$ device holding element and the $n^{th}$ device holding element.

Preferably, the power delivery mechanism includes a differential pulley for being rotated by the rotation of the electric motor; a first belt for being rotated by the rotation of the differential pulley to deliver power to the $1^{st}$ device holding element and the $n^{th}$ device holding element such that the $1^{st}$ device holding element moves in a direction opposite to the $n^{th}$ device holding element; and a driven pulley arranged to face the differential pulley.

In accordance with still another aspect of the present invention, there is provided a pick and place apparatus including a $1^{st}$ to an $n^{th}$ device holding element arranged in a front row; an $(n+1)^{th}$ to a $2n^{th}$ device holding element arranged in a rear row to face the $1^{st}$ to the $n^{th}$ device holding element; a plurality of pitch setting rings for connecting every one of the $1^{st}$ to the $n^{th}$ and the $(n+1)^{th}$ to the $2n^{th}$ device holding elements to its neighboring one(s) of the $1^{st}$ to the $n^{th}$ and the $(n+1)^{th}$ to the $2n^{th}$ device holding elements, and restricting a maximum pitch between the $1^{st}$ to the $n^{th}$ and the $(n+1)^{th}$ to the $2n^{th}$ device holding elements; a first power delivery mechanism for delivering power to the $1^{st}$ device holding element and the $n^{th}$ device holding element such that the $1^{st}$ device holding element moves in a direction opposite to the $n^{th}$ device holding element; a second power delivery mechanism for delivering power to the $(n+1)^{th}$ device holding element and the $2n^{th}$ device holding element such that the $(n+1)^{th}$ device holding element moves in a direction opposite to the $2n^{th}$ device holding element; and a power supply mechanism for supplying power to the first and the second power delivery mechanism.

Preferably, the power supply mechanism is an electric motor capable of forward and reverse rotation, the first power delivery mechanism includes a first differential pulley for being rotated by the rotation of the electric motor; a first belt for being rotated by the rotation of the first differential pulley to deliver power to the $1^{st}$ device holding element and the $n^{th}$ device holding element such that the $1^{st}$ device holding element moves in a direction opposite to the $n^{th}$ device holding element; and a first driven pulley arranged to face the first differential pulley, and the second power delivery mechanism includes a second differential pulley for being rotated by the rotation of the electric motor; a second belt for being rotated by the rotation of the second differential pulley to deliver power to the $(n+1)^{th}$ device holding element and the $2n^{th}$ device holding element such that the $(n+1)^{th}$ device holding element moves in a direction opposite to the $2n^{th}$ device holding element; and a second driven pulley arranged to face the second differential pulley.

Preferably, the power supply mechanism includes a pneumatic cylinder; a rack for moving linearly by an operation of the pneumatic cylinder; and a pinion for being rotated by the linear movement of the rack, the first power delivery mechanism includes a first differential pulley for being rotated by the rotation of the pinion; a first belt for being rotated by the rotation of the first differential pulley to deliver power to the $1^{st}$ device holding element and the $n^{th}$ device holding element such that the $1^{st}$ device holding element moves in a direction opposite to the $n^{th}$ device holding element; and a first driven pulley arranged to face the first differential pulley, and the second power delivery mechanism includes a second differential pulley for being rotated by the rotation of the pinion; a second belt for being rotated by the rotation of the second differential pulley to deliver power to the $(n+1)^{th}$ device holding element and the $2n^{th}$ device holding element such that the $(n+1)^{th}$ device holding element moves in a direction opposite to the $2n^{th}$ device holding element; and a second driven pulley arranged to face the second differential pulley.

ADVANTAGEOUS EFFECTS

As described above, in accordance with the present invention, an electric motor and/or a belt are employed instead of a pair of cylinders for supplying power to adjust the pitches between the device holding elements. Further, by applying the fact that an upper part of a belt moves in a direction opposite to that of a lower part of the belt, both the upper and the lower part of the belt are used such that only a single power delivery mechanism can change the pitches between the device holding elements. Thus, lengthwise pitches between the device holding elements arranged in a front and a rear row can be adjusted by using only a single power supply mechanism, thereby reducing the weight and the production cost of the pick and place apparatus.

BRIEF DESCRIPTION OF THE DRAWINGS

The above and other objects and features of the present invention will become apparent from the following description of preferred embodiments given in conjunction with the accompanying drawings, in which.

BEST MODE FOR CARRYING OUT THE INVENTION

Hereinafter, preferred embodiments of the present invention will be described in detail with reference to the accompanying drawings.

Figure 1:
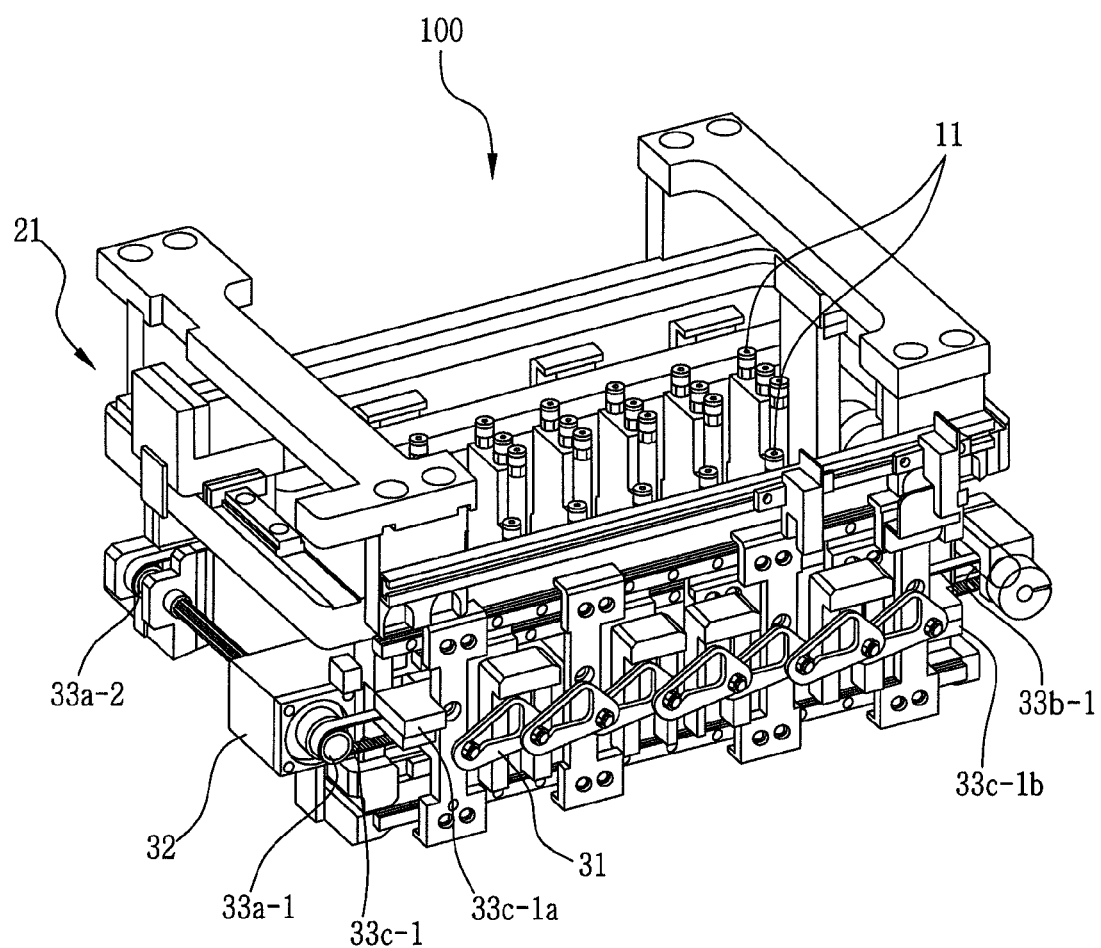
FIG. 1 shows a front perspective view of a pick and place apparatus in accordance with a preferred embodiment of the present invention.
Figure 2:
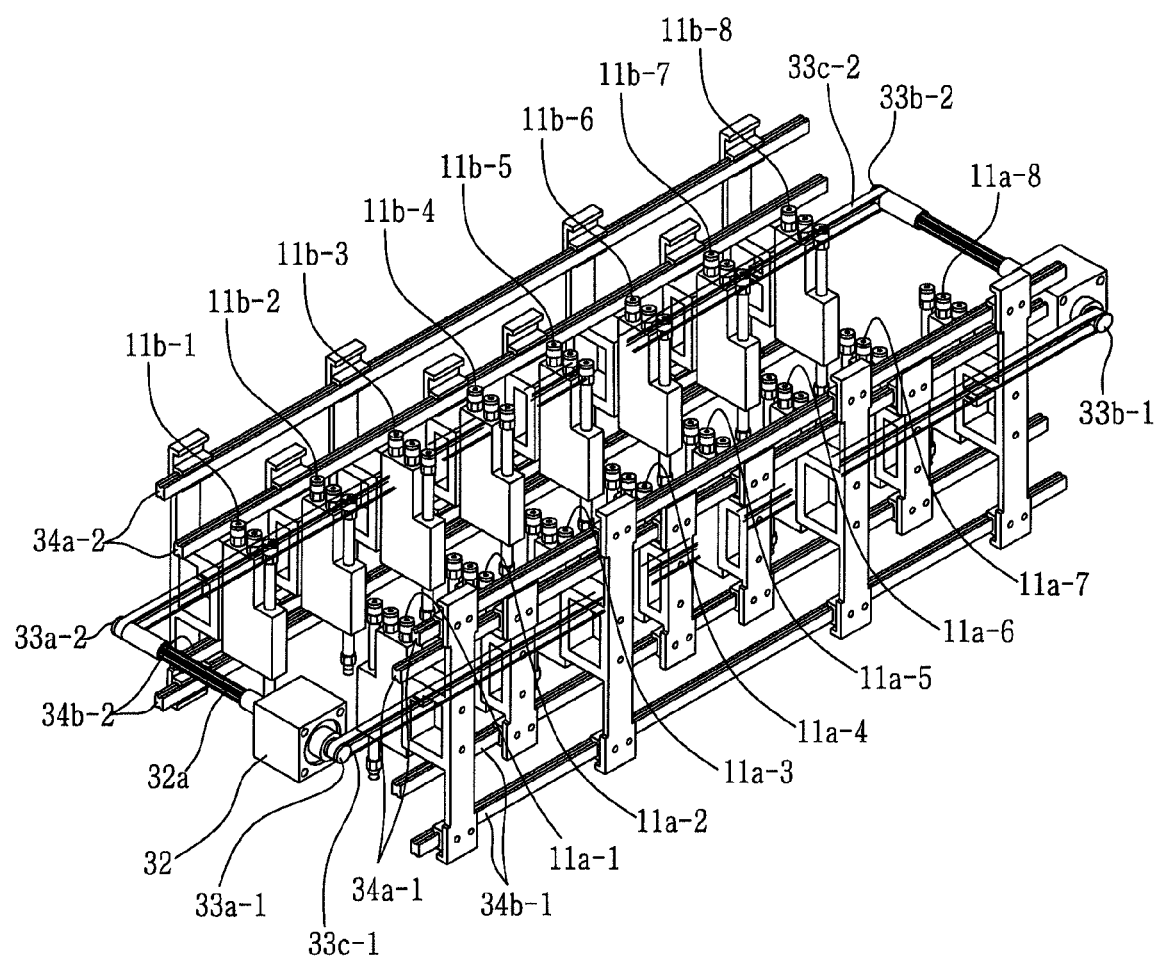
FIG. 2 presents a partial perspective view showing main parts of the pick and place apparatus shown in FIG. 1.
Figure 3:
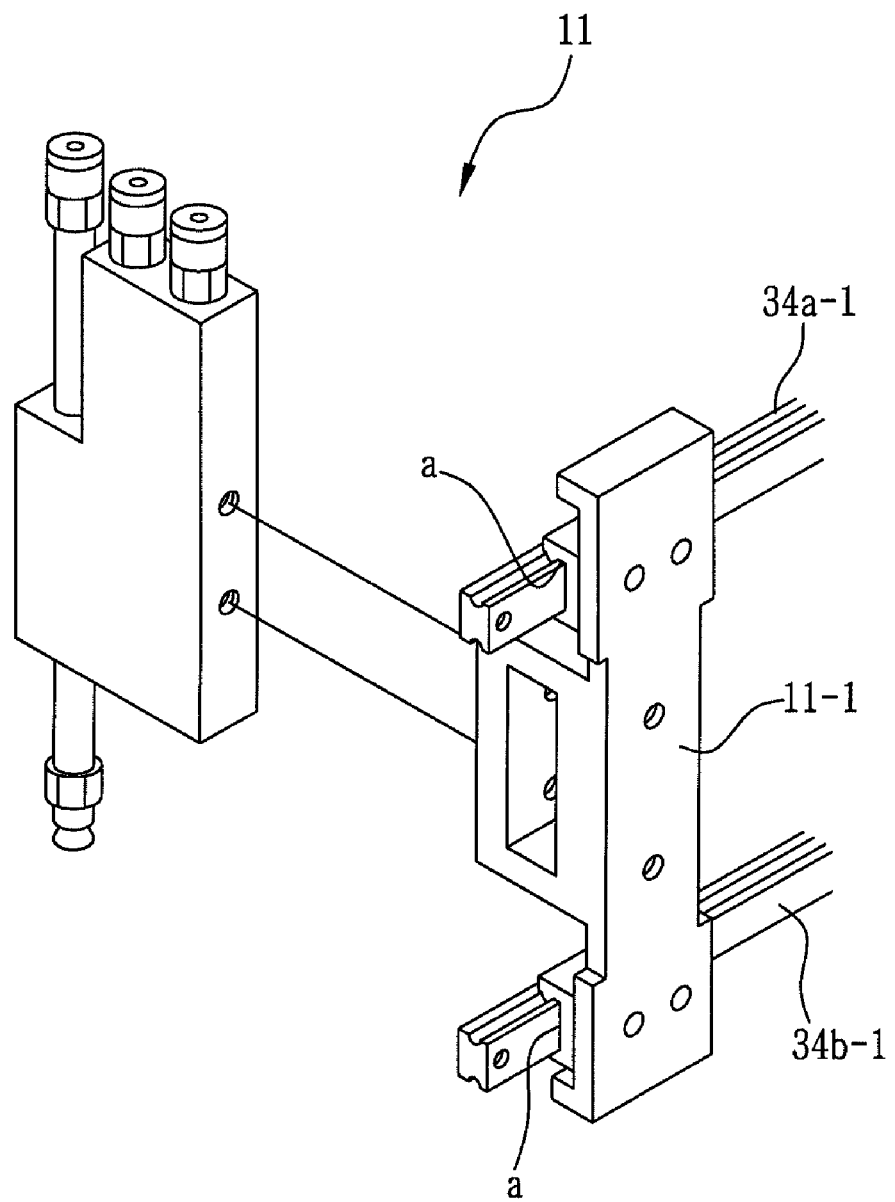
FIG. 3 depicts an exploded perspective view showing a device holding element of the pick and place apparatus of FIG. 1.

FIG. 1 shows a front perspective view of a pick and place apparatus in accordance with a preferred embodiment of the present invention; FIG. 2 presents a partial perspective view showing main parts of the pick and place apparatus shown in FIG. 1; and FIG. 3 depicts an exploded perspective view showing a device holding element of the pick and place apparatus of FIG. 1.

As shown therein, a pick and place apparatus 100 in accordance with a preferred embodiment of the present invention includes front-row device holding elements 11a-1 to 11a-8; rear-row device holding elements 11b-1 to 11b-8; a widthwise pitch control unit 21; and a lengthwise pitch control unit.

The device holding elements 11a-1 to 11a-8 are arranged in the front row, whereas the device holding elements 11b-1 to 11b-8 are arranged in the rear row to face the device holding elements 11a-1 to 11a-8 in the front row in one-to-one correspondence. The device holding elements 11a-1 to 11a-8 and 11b-1 to 11b-8 are adapted to grasp or quit the grasp of semiconductor devices to transfer the semiconductor devices from a customer tray (not shown) to a test tray (not shown) or from the test tray back to the customer tray. In the present embodiment, the device holding elements 11a-1 to 11a-8 in the front row are a $1^{st}$ to an $8^{th}$ device holding elements, respectively, and the device holding elements 11b-1 to 11b-8 in the rear row are a $9^{th}$ to a $16^{th}$ device holding elements, respectively. Further, as shown in FIG. 3, the device holding elements 11a-1 to 11a-8 and 11b-1 to 11b-8 have guide blocks 11-1 formed therein LM guide grooves a for guiding the device holding elements along LM guides 34a-1, 34b-1, 34a-2 and 34b-2 that will be described later. Since the function and the detailed configuration of the device holding elements 11 are disclosed in many published documents, and also described in Korean Patent Application No. 2005-0017464 previously filed by the applicants of the present invention, the description thereof will be omitted for simplicity.

Figure 4:
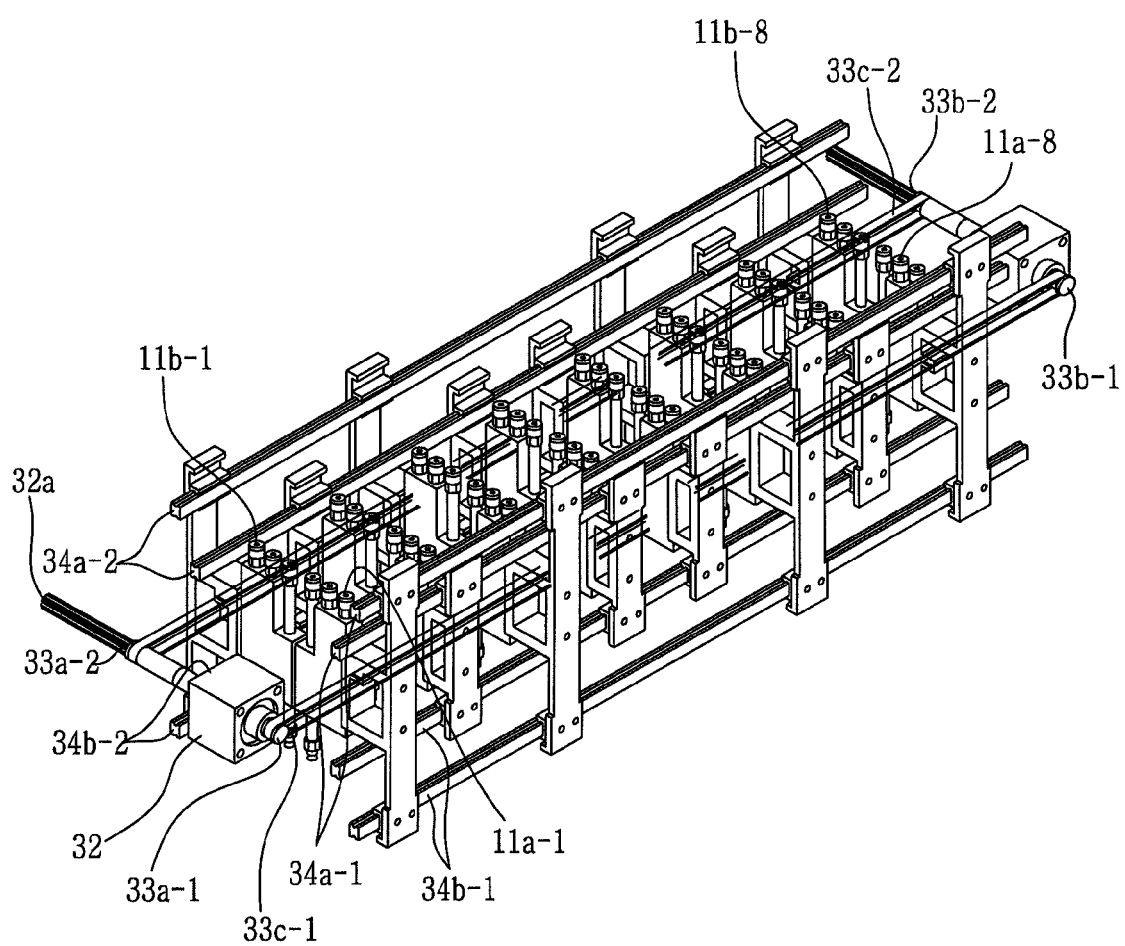
FIG. 4 provides a partial perspective view for explaining widthwise pitches in the pick and place apparatus of FIG. 1.

The widthwise pitch control unit 21 is used to control to-and-fro directional pitches, i.e., widthwise directional pitches, between the front-row device holding elements 11a-1 to 11a-8 and the rear-row device holding elements 11b-1 to 11b-8. FIG. 4 depicts a state where the pitches between the front-row device holding elements 11a-1 to 11a-8 and the rear-row device holding elements 11b-1 to 11b-8 are reduced only by an operation of the widthwise pitch control unit 21. On the other hand, FIG. 2 describes a state where the pitches between the front-row device holding elements 11a-1 to 11a-8 and the rear-row device holding elements 11b-1 to 11b-8 are increased by another operation of the widthwise pitch control unit 21. Since the widthwise pitch control unit 21 is also disclosed in many published documents including Korean Patent Application No. 2005-0017464 previously filed by the applicants of the present invention, the description thereof will be omitted for simplicity.

The lengthwise pitch control unit is used to control pitches between the neighboring device holding element(s) 11 in each of the front and the rear row. For the purpose, the lengthwise pitch control unit includes a plurality of pitch setting rings 31; a power supply mechanism; a first and a second power delivery mechanism; a first upper and a first lower LM guide 34a-1 and 34b-1 for guiding the linear movements of the front-row device holding elements 11a-1 to 11a-8; and a second upper and a second lower LM guides 34a-2 and 34b-2 for guiding the linear movements of the rear-row device holding elements 21b-1 to 21b-8. Each part of the lengthwise pitch control unit having the above configuration will be described in detail hereinafter.

The plurality of pitch setting rings 31 include seven front-row rings and seven rear-row rings. The pitch setting rings 31 serve to connect every one of the device holding elements 11 to its lengthwisely neighboring one(s) in such a manner that the device holding elements 11 can be moved in a lengthwise direction to control the lengthwise pitches therebetween, while limiting a maximum lengthwise pitch between the device holding elements 11.

The power supply mechanism supplies power for the lengthwise movements of the device holding elements 11a-1 to 11a-8 and 11b-1 to 11b-8 when the lengthwise pitches between the device holding elements 11a-1 to 11a-8 and 11b-1 to 11b-8 are adjusted. In the present embodiment, an electric motor 32 capable of both forward and reverse rotation is used as the power supply mechanism, whose exemplary modification will be described later.

The first power delivery mechanism includes a first differential pulley 33a-1; a first driven pulley 33b-1; and a first belt 33c-1.

The first differential pulley 33a-1 is rotated by the rotation of the electric motor 32, and preferably a timing pulley having gears formed thereon for a suitable delivery of the power.

The first driven pulley 33b-1 is installed to face the first differential pulley 33a-1.

Herein, the first differential pulley 33a-1 and the first driven pulley 33b-1 serve as rotational axes of the first belt 33c-1.

The first belt 33c-1 is rotated by the rotation of the first differential pulley 33a-1 to deliver the power required for the lengthwise movements of the front-row device holding elements 11a-1 to 11a-8, and preferably a timing belt corresponding to the first differential pulley 33a-1 for a suitable delivery of the power. For the power delivery, the first belt 33c-1 includes a first coupling part 33c-1a (shown in FIG. 1) for being coupled to the first device holding element 11a-1; and a second coupling part 33c-1b (shown in FIG. 1) for being coupled to the eighth device holding element 11a-8. Herein, the first coupling part 33c-1a is positioned at an upper portion upper than a line passing the rotational axes of the first differential pulley 33a-1 and the first driven pulley 33b-1, whereas the second coupling part 33c-1b is positioned at a lower portion lower than the line passing the rotational axes of the first differential pulley 33a-1 and the first driven pulley 33b-1.

The second power delivery mechanism includes a second differential pulley 33a-2; a second driven pulley 33b-2; and a second belt 33c-2.

The second differential pulley 33a-2 is rotated by the rotation of the electric motor 32, and preferably a timing pulley having gears formed thereon for a suitable delivery of the power.

The second driven pulley 33b-2 is installed to face the second differential pulley 33a-2.

Herein, the second differential pulley 33a-2 and the second driven pulley 33b-2 serve as rotational axes of the second belt 33c-2.

The second belt 33c-2 is rotated by the rotation of the second differential pulley 33a-2 to deliver the power required for the lengthwise movements of the rear-row device holding elements 11b-1 to 11b-8, and preferably a timing belt corresponding to the second differential pulley 33a-2 for a suitable delivery of the power. For the power delivery, the second belt 33c-2 includes a third coupling part (not shown) for being coupled to the $9^{th}$ device holding element 11b-1; and a fourth coupling part (not shown) for being coupled to the $16^{th}$ device holding element 11b-8. Herein, the third coupling part is positioned at an upper portion upper than a line passing the rotational axes of the second differential pulley 33a-2 and the second driven pulley 33b-2, whereas the fourth coupling part is positioned at a lower portion lower than the line passing the rotational axes of the second differential pulley 33a-2 and the second driven pulley 33b-2.

The first upper and the first lower LM guide 34a-1 and 34b-1 and the second upper and the second lower LM guide 34a-2 and 34b-2 are configured to be elongated in the lengthwise direction, and inserted into the LM guide grooves a of the device holding elements 11 to guide the lengthwise movements of the device holding elements 11 at an upper and an lower position, respectively.

Further, in the present embodiment, the first belt 33c-1 of the first power delivery mechanism and the second belt 33c-2 of the second power delivery mechanism can be both rotated by the electric motor 32 alone. To this end, a rotational shaft 32a connected to the electric motor 32 and the second differential pulley 33a-2 may be configured by a spline shaft, one part of which can be inserted into and gear-engaged with the other part of which, thereby enabling to deliver power.

Figure 5:
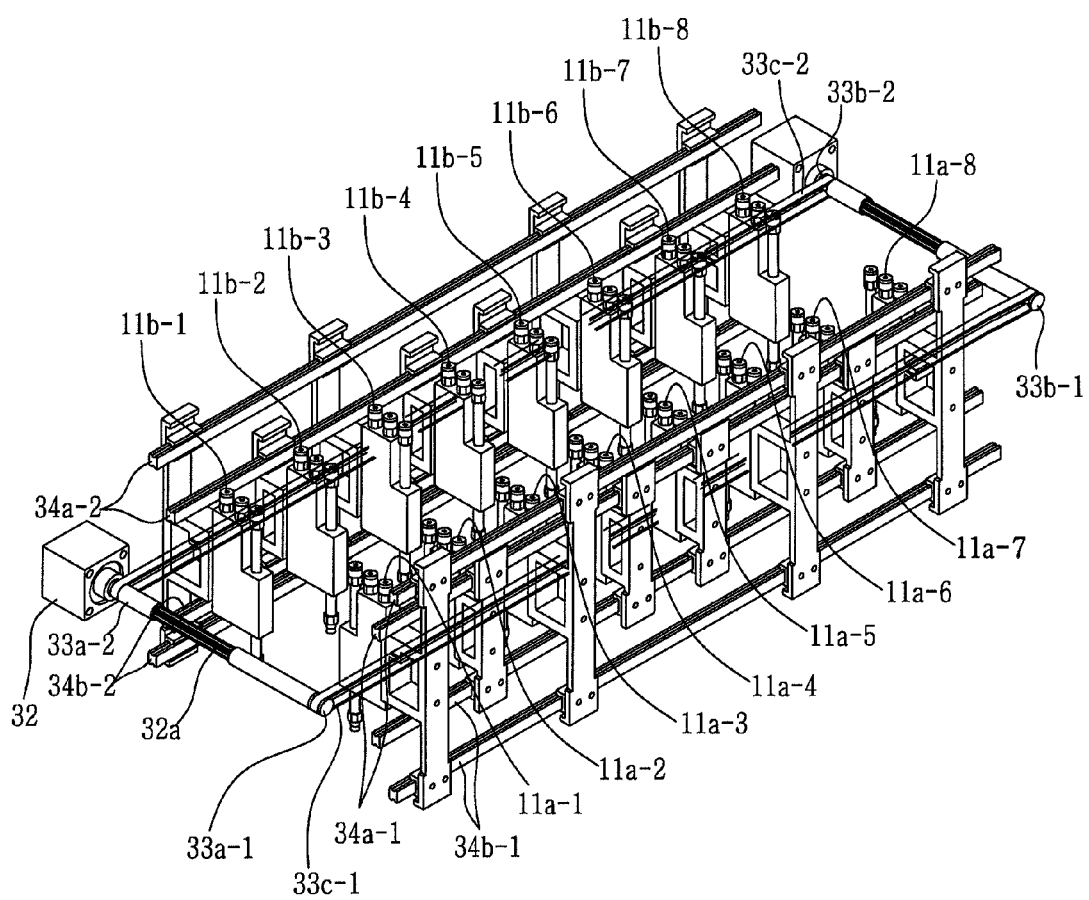
FIG. 5 offers a partial perspective view showing main parts of a pick and place apparatus in accordance with a modification of the preferred embodiment of the present invention.

Although the electric motor 32 is positioned between the first and the second differential pulley 33a-1 and 33a-2 in FIG. 2, it is also possible to position the electric motor 32 in the rear of the second pulley 33a-2 as shown in FIG. 5 (in which same reference numerals designate same elements shown in FIG. 2).

The operational statuses of the pick and place apparatus 100 in accordance with the preferred embodiment of the present invention configured as above will be described with reference to FIGS. 6 and 7 in case of a loading operation, i.e., in a case where semiconductor devices accommodated in a customer tray are transferred into a test tray.

First, the pick and place apparatus is moved to an upper side of the customer tray. At this time, for grasping the semiconductor devices accommodated in the customer tray, the widthwise pitch control unit 21 and the lengthwise pitch control unit are operated to reduce the widthwise pitches and the lengthwise pitches between the device holding elements 11a-1 to 11a-8 and 11b-1 to 11b-8 as shown in FIG. 6.

Figure 6:
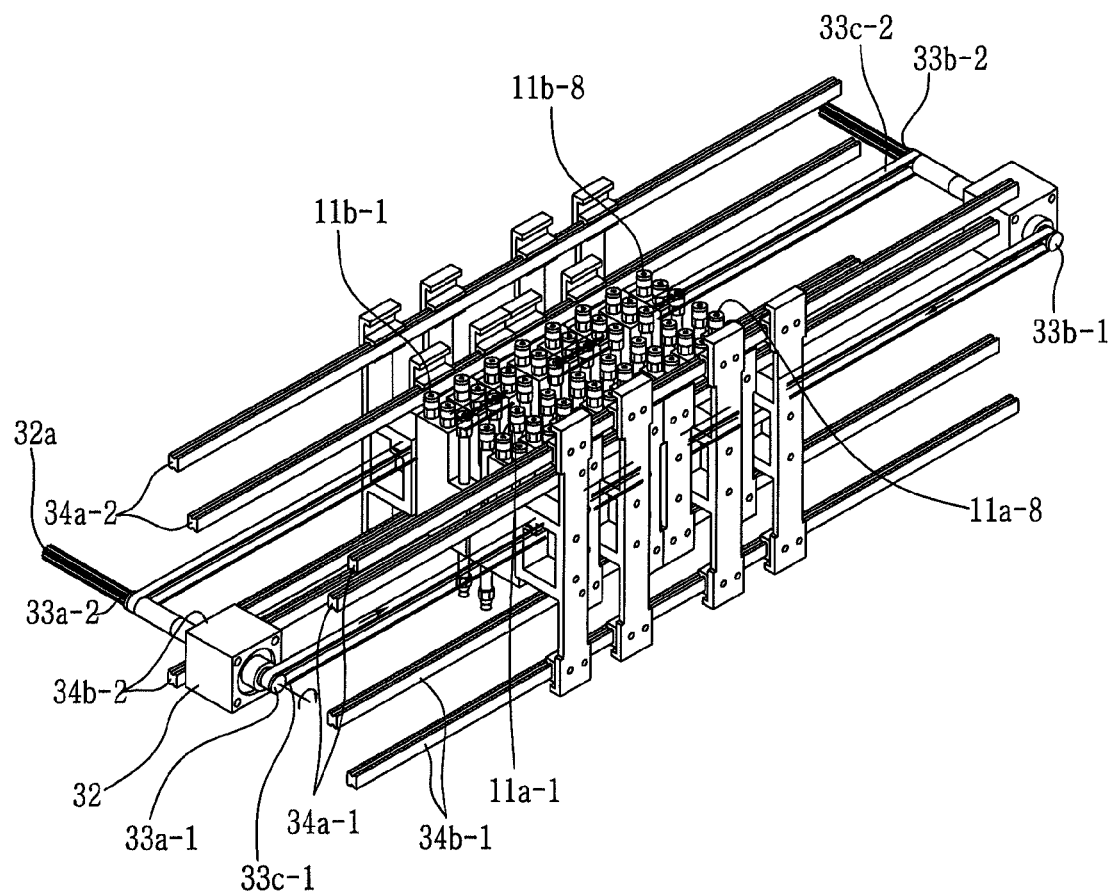
FIGS. 6 and 7 illustrate an operational status of the pick and place apparatus of FIG. 1.

Herein, the lengthwise pitches are made by a forward rotation of the electric motor 32 as can be seen by FIG. 6. That is, if the electric motor 32 is forward-rotated in a direction designated by an arrow shown in FIG. 6, the first and the second differential pulleys 33a-1 and 33a-2 are forward-rotated, and thus the first and the second belt 33c-1 and 33c-2 are rotated by the forward rotation of the differential pulleys, so that the first and the second driven pulleys 33b-1 and 33b-2 are rotated. Therefore, the first coupling part 33c-1a of the first belt 33c-1 and the third coupling part of the second belt 33c-2 are moved rightward, whereas the second coupling part 33c-1b of the first belt 33c-1 and the fourth coupling part of the second belt 33c-2 are moved leftward. Thus, the $1^{st}$ and $9^{th}$ device holding elements 11a-1 and 11b-1 respectively coupled to the first coupling part 33c-1a and the third coupling part are moved rightward, whereas the $8^{th}$ and $16^{th}$ device holding elements 11a-8 and 11b-8 respectively coupled to the second coupling part 33c-1b and the fourth coupling part are moved leftward. That is, the $1^{st}$ and $9^{th}$ device holding elements 11a-1 and 11b-1 are moved in a direction opposite to that of the $8^{th}$ and $16^{th}$ device holding elements 11a-8 and 11b-8. In this manner, as the $1^{st}$ and $9^{th}$ device holding elements 11a-1 and 11b-1 and the $8^{th}$ and $16^{th}$ device holding elements 11a-8 and 11b-8 approach each other, the lengthwise pitches between the $1^{st}$ and $9^{th}$ device holding elements 11a-1 and 11b-1 and the $8^{th}$ and $16^{th}$ device holding elements 11a-8 and 11b-8 are reduced. The above-described lengthwise movements of the $1^{st}$ and $9^{th}$ device holding elements 11a-1 and 11b-1 and the $8^{th}$ and $16^{th}$ device holding elements 11a-8 and 11b-8 continue until every one of the device holding elements 11 come into contact with its neighboring one(s) of the device holding elements 11.

Meanwhile, after the device holding elements 11 grasp the semiconductor devices accommodated in the customer tray, the widthwise pitch control unit 21 and the lengthwise pitch control unit are operated again to increase the pitches between the widthwise and the lengthwise pitches between the device holding elements 11a-1 to 11a-8 and 11b-1 to 11b-8.

Figure 7:
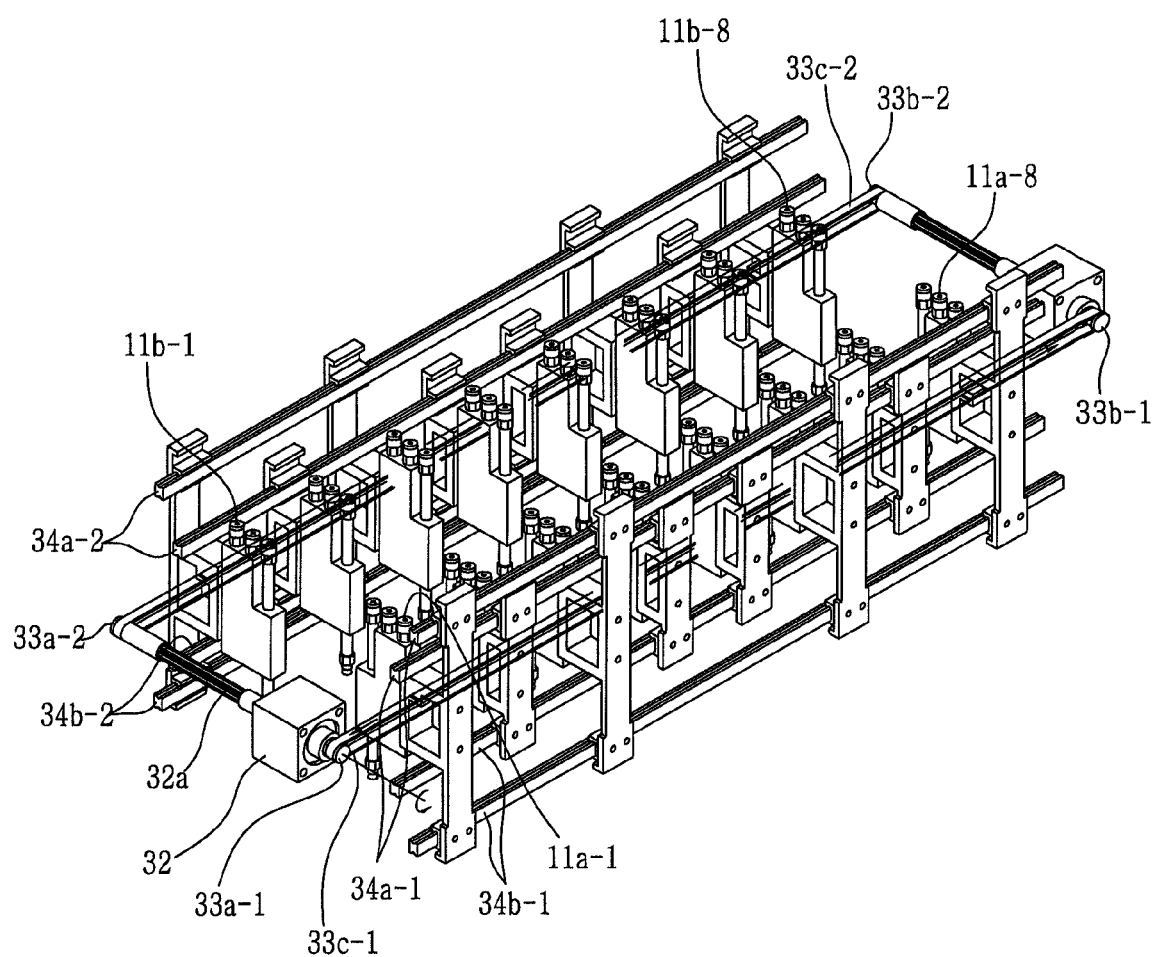

Herein, the lengthwise pitches are made by a reverse rotation of the electric motor 32 as can be seen by FIG. 7. That is, if the electric motor 32 is reverse-rotated in a direction designated by an arrow shown in FIG. 7, the first and the second differential pulleys 33a-1 and 33a-2 are reverse-rotated, and thus the first and the second belt 33c-1 and 33c-2 are rotated by the reverse rotation of the differential pulleys, thereby making the first and the second driven pulleys 33b-1 and 33b-2 be rotated. Therefore, the first coupling part 33c-1a of the first belt 33c-1 and the third coupling part of the second belt 33c-2 are moved leftward, whereas the second coupling part 33c-1b of the first belt 33c-1 and the fourth coupling part of the second belt 33c-2 are moved rightward. Thus, the $1^{st}$ and $9^{th}$ device holding elements 11a-1 and 11b-1 respectively coupled to the first coupling part 33c-1a and the third coupling part are moved leftward, whereas the $8^{th}$ and $16^{th}$ device holding elements 11a-8 and 11b-8 respectively coupled to the second coupling part 33c-1b and the fourth coupling part are moved rightward. In this manner, as the $1^{st}$ and $9^{th}$ device holding elements 11a-1 and 11b-1 and the $8^{th}$ and $16^{th}$ device holding elements 11a-8 and 11b-8 recede from each other, the lengthwise pitches between the $1^{st}$ and $9^{th}$ device holding elements 11a-1 and 11b-1 and the $8^{th}$ and $16^{th}$ device holding elements 11a-8 and 11b-8 are increased. The above-described lengthwise movements of the $1^{st}$ and $9^{th}$ device holding elements 11a-1 and 11b-1 and the $8^{th}$ and $16^{th}$ device holding elements 11a-8 and 11b-8 continue until the movements of the device holding elements 11 become restricted by the pitch setting rings 31.

After the pick and place apparatus 100 is moved to an upper side of the test tray and each of the device holding elements quits the grasp of the semiconductor devices, the loading operation is completed when the semiconductor devices are loaded into the test tray.

An unloading operation, i.e., an operation of transferring the semiconductor devices accommodated in the test tray into the customer tray after the tests of the semiconductor devices are completed, can be performed by carrying out sequences opposite to those as described above. Therefore, the description thereof will be omitted for simplicity.

Figure 8:
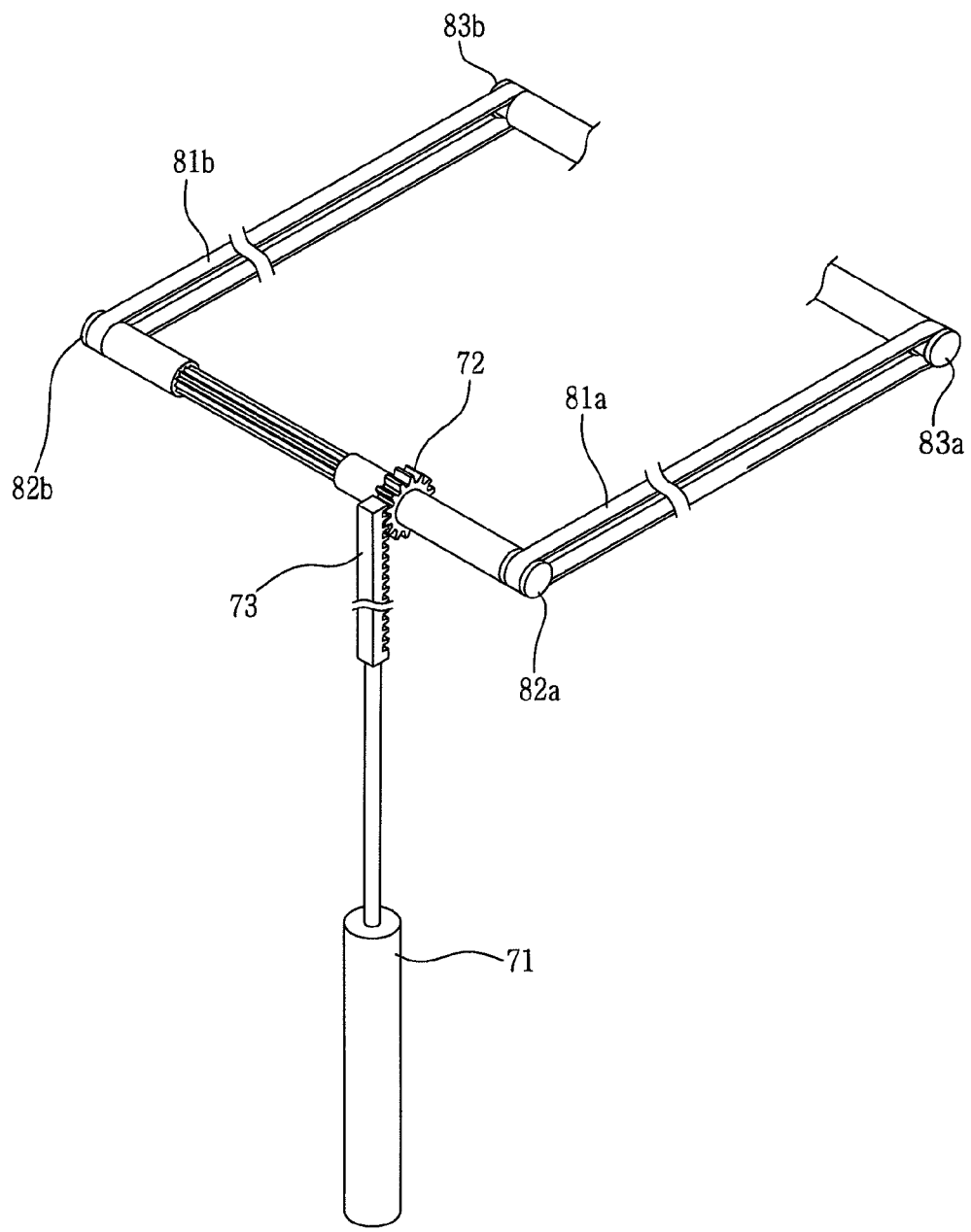
FIG. 8 presents an exemplary modification of the power supply mechanism and the power delivery mechanism in the pick and place apparatus of FIG. 1.

FIG. 8 shows an exemplary modification of the power supply mechanism and the power delivery mechanism in accordance with the preferred embodiment shown in FIG. 1.

As shown therein, the power supply mechanism includes a pneumatic cylinder 71; a pinion 72; and a rack 73. Further, the power delivery mechanism includes a first and a second belt 81a and 81b; a first and a second differential pulley 82a and 82b; and a first and a second driven pulley 83a and 83b.

In the modification shown in FIG. 8, when the rack 73 is moved upward or downward by the operation of the pneumatic cylinder 71, the pinion 72 is rotated in a forward or reverse direction by the movement of the rack 73, so that the first and the second differential pulley 82a and 82b are rotated. Thus, the first and the second belt 81a and 81b are rotated by the rotation of the first and the second differential pulley, and the lengthwise pitches between the device holding elements 11 can be adjusted by the rotation of the first and the second belt 81a and 81b.

While the invention has been shown and described with respect to the preferred embodiment, it will be understood by those skilled in the art that various changes and modifications may be made without departing from the scope of the invention as defined in the following claims.

The invention claimed is:

1. A pick and place apparatus comprising:
a $1^{st}$ to an $n^{th}$ device holding element arranged in a lengthwise direction, every one of the $1^{st}$ to the nth device holding element being connected to its neighboring one(s) of the $1^{st}$ to the $n^{th}$ device holding element by means of at least one pitch setting ring;
a first belt having a first coupling part at an upper part thereof for being coupled to the $1^{st}$ device holding element and a second coupling part at a lower part thereof for being coupled to the nth device holding element; and
a first driven pulley and a first differential pulley for being rotated by being engaged with the first belt to move the $1^{st}$ and the $n^{th}$ device holding element such that the $1^{st}$ device holding element moves in a direction opposite to the nth device holding element,
wherein the $1^{st}$ device holding element and $n^{th}$ device holding element are outermost ones of the holding elements in the lengthwise direction.

2. The pick and place apparatus of claim 1, wherein the first differential pulley is rotated by an electric motor.

3. The pick and place apparatus of claim 1, wherein the first differential pulley is rotated by a pneumatic cylinder in connection with a rack and a pinion.

4. The pick and place apparatus of claim 1, wherein the first belt is a timing belt, and the first differential pulley is a timing pulley.

5. The pick and place apparatus of claim 1, wherein the $1^{st}$ to the $n^{th}$ device holding element moves linearly along at least one LM guide.

6. The pick and place apparatus of claim 1, further comprising:
an $(n+1)^{th}$ to a $2n^{th}$ device holding element arranged to respectively face the $1^{st}$ to the $n^{th}$ device holding element, every one of the $(n+1)^{th}$ to the $2n^{th}$ device holding element being connected to its lengthwisely neighboring one(s) of the $(n+1)^{th}$ to the $2n^{th}$ device holding element by means of at least one pitch setting ring;
a second belt having a third coupling part at an upper part thereof for being coupled to the $(n+1)^{th}$ device holding element and a fourth coupling part at a lower part thereof for being coupled to the $2n^{th}$ device holding element; and
a second driven pulley and a second differential pulley for being rotated by being engaged with the second belt to move the $(n+1)^{th}$ and the $2n^{th}$ device holding element such that the $(n+1)^{th}$ device holding element moves in a direction opposite to the $2n^{th}$ device holding element.

7. The pick and place apparatus of claim 6, wherein the first and the second differential pulley are rotated by a single electric motor.

8. The pick and place apparatus of claim 6, wherein the first and the second differential pulley are rotated by a single pneumatic cylinder in connection with a rack and a pinion.

9. The pick and place apparatus of claim 1, wherein when the first belt rotates in a direction where the $1^{st}$ and $n^{th}$ device holding element approach each other, the $1^{st}$ to the $n^{th}$ device holding elements push each other such that lengthwise pitches between the $1^{st}$ to the $n^{th}$ device holding elements become minimum.

10. The pick and place apparatus of claim 1, wherein when the first belt rotates in a direction where the $1^{st}$ and $n^{th}$ device holding element move away from each other, the $1^{st}$ to the $n^{th}$ device holding elements pull each other via the pitch setting rings such that lengthwise pitches between the $1^{st}$ to the $n^{th}$ device holding elements become maximum.

11. A pick and place apparatus comprising:
a $1^{st}$ to an $n^{th}$ device holding element arranged in a predetermined arrangement;
a plurality of pitch setting rings for connecting every one of the $1^{st}$ to the $n^{th}$ device holding element to its neighboring one(s) of the $1^{st}$ to the $n^{th}$ device holding element, and restricting a maximum pitch between the $1^{st}$ to the $n^{th}$ device holding element;
a first belt capable of forward and reverse rotation for moving the $1^{st}$ device holding element and the nth device holding element such that the $1^{st}$ device holding element moves in a direction opposite to the nth device holding element;
a differential pulley and a driven pulley for rotating the first belt; and a power supply mechanism for supplying power for the forward and the reverse rotation of the differential pulley, wherein the $1^{st}$ device holding element and $n^{th}$ device holding element are outermost ones of the holding elements in the lengthwise direction.

12. The pick and place apparatus of claim 11, wherein the first belt includes:
  a first coupling part positioned at an upper part of the first belt to be coupled to the 1st device holding element; and
  a second coupling part positioned at a lower part of the first belt to be coupled to the nth device holding element.

13. The pick and place apparatus of claim 11, wherein the power supply mechanism is an electric motor.

14. A pick and place apparatus comprising:
  a $1^{st}$ to an nth device holding element arranged in a predetermined arrangement;
  a plurality of pitch setting rings for connecting every one of the $1^{st}$ to the nth device holding element to its neighboring one(s) of the $1^{st}$ to the $n^{th}$ device holding element, and restricting a maximum pitch between the $1^{st}$ to the $n^{th}$ device holding element;
  an electric motor capable of forward and reverse rotation for moving the $1^{st}$ device holding element and the nth device holding element such that the $1^{st}$ device holding element moves in a direction opposite to the $n^{th}$ device holding element; and
  a power delivery mechanism for delivering power of the electric motor to the $1^{st}$ device holding element and the $n^{th}$ device holding element,
  wherein the $1^{st}$ device holding element and $n^{th}$ device holding element are outermost ones of the holding elements in the lengthwise direction.

15. The pick and place apparatus of claim 14, wherein the power delivery mechanism includes:
  a differential pulley for being rotated by the rotation of the electric motor;
  a first belt for being rotated by the rotation of the differential pulley to deliver power to the 1st device holding element and the $n^{th}$ device holding element such that the 1st device holding element moves in a direction opposite to the nth device holding element; and
  a driven pulley arranged to face the differential pulley.

16. A pick and place apparatus comprising:
  a $1^{st}$ to an $n^{th}$ device holding element arranged in a front row;
  an $(n+1)^{th}$ to a $2n^{th}$ device holding element arranged in a rear row to face the $1^{st}$ to the $n^{th}$ device holding element;
  a plurality of pitch setting rings for connecting every one of the $1^{st}$ to the $n^{th}$ and the $(n+1)^{th}$ to the $2n^{th}$ device holding elements to its neighboring one(s) of the $1^{st}$ to the $n^{th}$ and the $(n+1)^{th}$ to the $2n^{th}$ device holding elements, and restricting a maximum pitch between the $1^{st}$ to the $n^{th}$ and the $(n+1)^{th}$ to the $2n^{th}$ device holding elements;
  a first power delivery mechanism for delivering power to the $1^{st}$ device holding element and the $n^{th}$ device holding element such that the $1^{st}$ device holding element moves in a direction opposite to the $n^{th}$ device holding element;
  a second power delivery mechanism for delivering power to the $(n+1)^{th}$ device holding element and the $2n^{th}$ device holding element such that the $(n+)^{st}$ device holding element moves in a direction opposite to the $2n^{th}$ device holding element; and
  a power supply mechanism for supplying power to the first and the second power delivery mechanism,
  wherein the $1^{st}$ device holding element and $n^{th}$ device holding element are outermost ones of the holding elements in the front row, and
  wherein the $(n+1)^{st}$ device holding element and $2n^{th}$ device holding element are outermost ones of the holding elements in the rear row.

17. The pick and place apparatus of claim 16, wherein the power supply mechanism is an electric motor capable of forward and reverse rotation, wherein the first power delivery mechanism includes:
  a first differential pulley for being rotated by the rotation of the electric motor;
  a first belt for being rotated by the rotation of the first differential pulley to deliver power to the $1^{st}$ device holding element and the $n^{th}$ device holding element such that the $1^{st}$ device holding element moves in a direction opposite to the nth device holding element; and
  a first driven pulley arranged to face the first differential pulley, and
wherein the second power delivery mechanism includes:
  a second differential pulley for being rotated by the rotation of the electric motor;
  a second belt for being rotated by the rotation of the second differential pulley to deliver power to the $(n+1)^{th}$ device holding element and the $2n^{th}$ device holding element such that the $(n+1)^{th}$ device holding element moves in a direction opposite to the $2n^{th}$ device holding element; and
  a second driven pulley arranged to face the second differential pulley.

18. The pick and place apparatus of claim 16, wherein the power supply mechanism includes:
  a pneumatic cylinder;
  a rack for moving linearly by an operation of the pneumatic cylinder; and
  a pinion for being rotated by the linear movement of the rack,
wherein the first power delivery mechanism includes:
  a first differential pulley for being rotated by the rotation of the pinion;
  a first belt for being rotated by the rotation of the first differential pulley to deliver power to the $1^{st}$ device holding element and the $n^{th}$ device holding element such that the $1^{st}$ device holding element moves in a direction opposite to the $n^{th}$ device holding element; and
  a first driven pulley arranged to face the first differential pulley, and
wherein the second power delivery mechanism includes:
  a second differential pulley for being rotated by the rotation of the pinion;
  a second belt for being rotated by the rotation of the second differential pulley to deliver power to the $(n+1)^{th}$ device holding element and the $2n^{th}$ device holding element such that the $(n+1)^{th}$ device holding element moves in a direction opposite to the $2n^{th}$ device holding element; and
  a second driven pulley arranged to face the second differential pulley.

* * * * *